(12) United States Patent
Sforzin et al.

(10) Patent No.: US 11,949,428 B2
(45) Date of Patent: Apr. 2, 2024

(54) ITERATIVE ERROR CORRECTION IN MEMORY SYSTEMS

(71) Applicant: Micron Technology, Inc., Boise, ID (US)

(72) Inventors: Marco Sforzin, Boise, ID (US); Di Hsien Ngu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 17 days.

(21) Appl. No.: 17/843,171

(22) Filed: Jun. 17, 2022

(65) Prior Publication Data

US 2023/0231573 A1 Jul. 20, 2023

Related U.S. Application Data

(60) Provisional application No. 63/301,028, filed on Jan. 19, 2022.

(51) Int. Cl.
*H03M 13/09* (2006.01)
*H03K 19/173* (2006.01)
*H03M 13/11* (2006.01)

(52) U.S. Cl.
CPC ...... *H03M 13/098* (2013.01); *H03K 19/1737* (2013.01); *H03M 13/1171* (2013.01); *H03M 13/1174* (2013.01)

(58) Field of Classification Search
None
See application file for complete search history.

(56) References Cited

U.S. PATENT DOCUMENTS

2021/0119848 A1\* 4/2021 Ibars Casas .......... H04L 1/0052
2021/0306003 A1\* 9/2021 Kim .................... H03M 13/1134
2022/0206958 A1\* 6/2022 LeMay ............... G06F 12/0253

FOREIGN PATENT DOCUMENTS

JP         2013214212 A  * 10/2013
WO    WO-2016122515 A1 *  8/2016

\* cited by examiner

*Primary Examiner* — Guerrier Merant
(74) *Attorney, Agent, or Firm* — Wood IP LLC

(57) ABSTRACT

A system and method for detecting and correcting memory errors in CXL components is presented. The method includes receiving, into a decoder, a memory transfer block (MTB), wherein the MTB comprises data and parity information, wherein the MTB is arranged in a first dimension and a second dimension. An error checking and a correction function on the MTB is performed using a binary hamming code logic within the decoder in the first dimension. An error checking and a correction function on the MTB is performed using a non-binary hamming code logic within the decoder in the second dimension. Further, the binary hamming code logic and the non-binary hamming code logic perform the error checking on the MTB simultaneously.

16 Claims, 18 Drawing Sheets

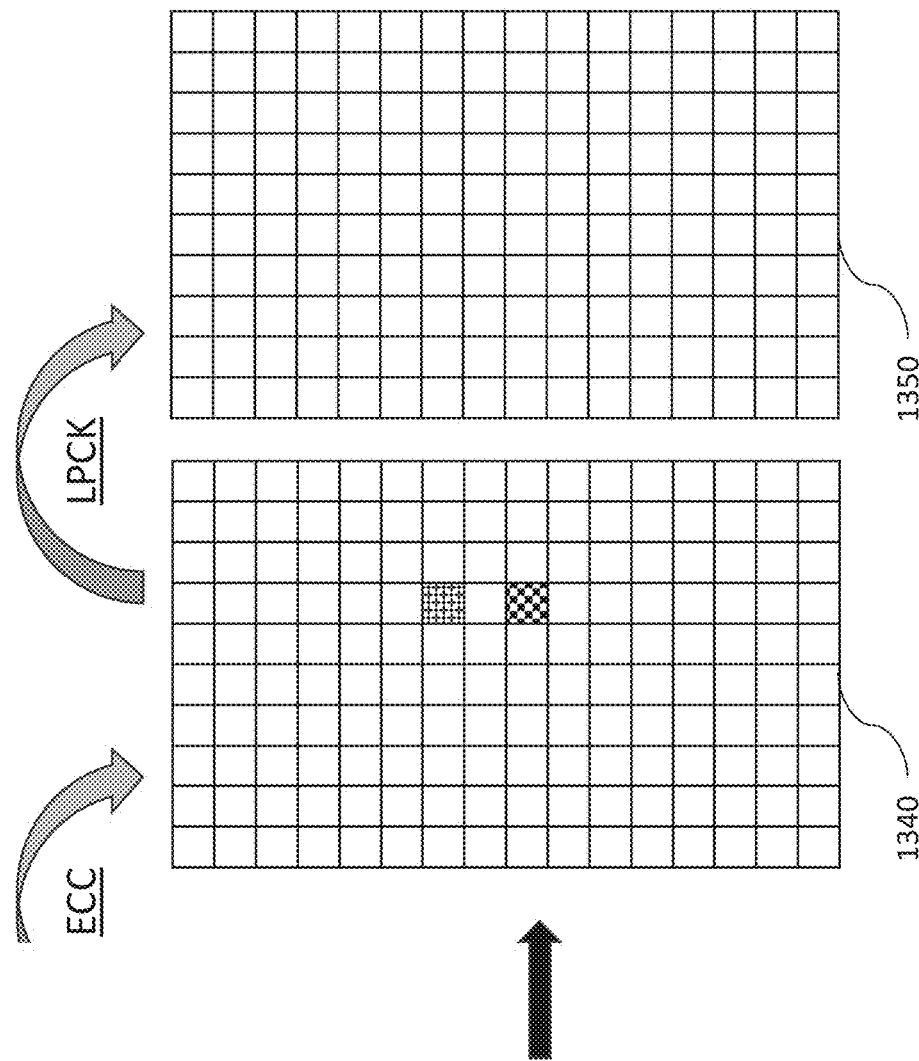

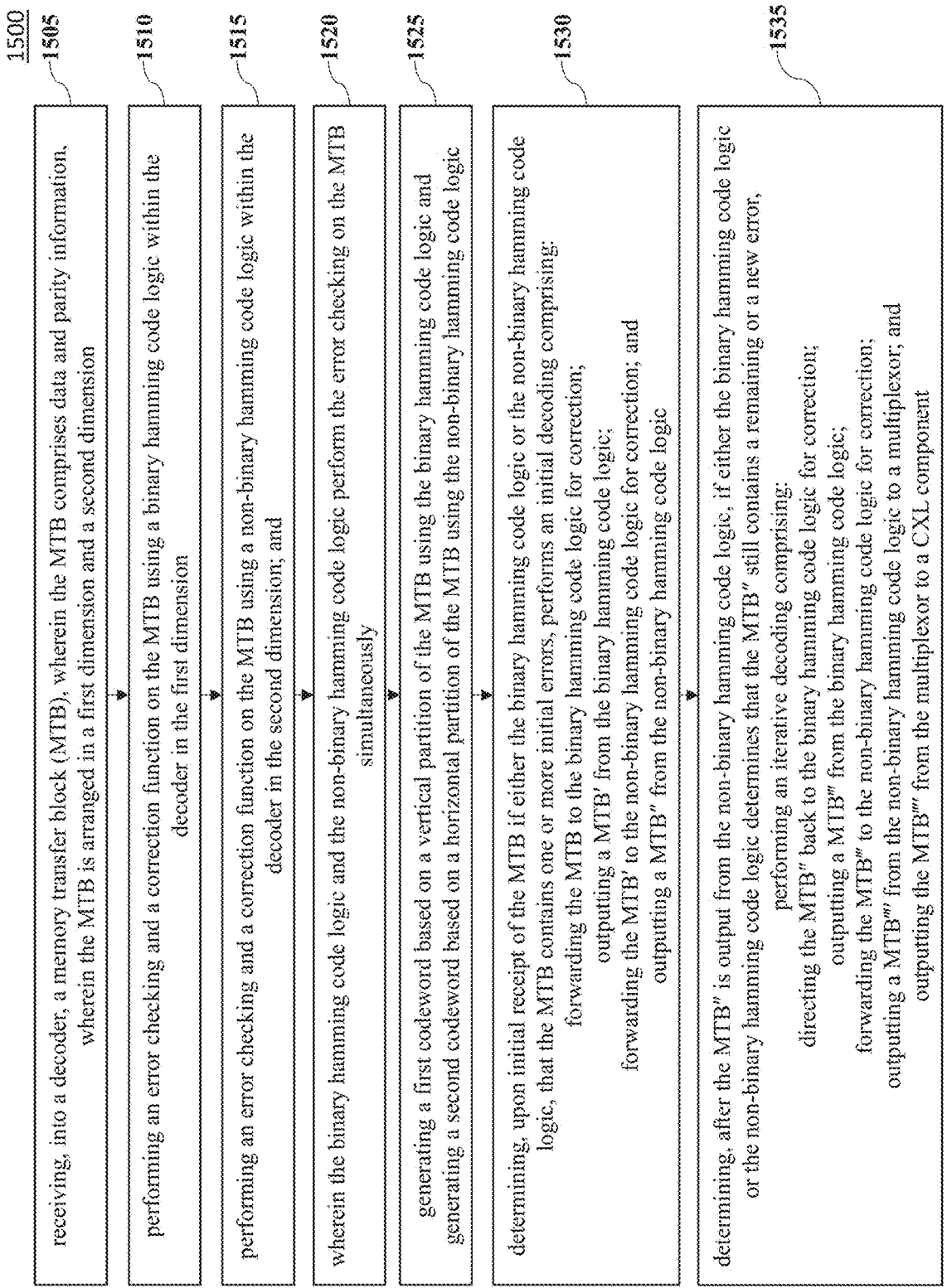

ITERATIVE ERROR CORRECTION IN MEMORY SYSTEMS

CROSS-REFERENCE TO RELATED APPLICATION

This application claims priority to U.S. Provisional Application No. 63/301,028 filed on Jan. 19, 2022, titled "Iterative Low Power Chip Kill", which is hereby expressly incorporated herein by reference in its entirety.

FIELD OF TECHNOLOGY

This disclosure relates generally to one or more systems and methods for memory, particularly directed to the correction of errors within the memory.

BACKGROUND

Memory devices are widely used to store information in various electronic devices such as computers, user devices, wireless communication devices, cameras, digital displays, and the like. Information is stored by programing memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read, or sense, the state of one or more memory cells within the memory device. To store information, a component may write, or program, one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-20 dimensional cross-point memory (3D cross point), not-or (NOR) and not-and (NAND) memory devices, and others. Memory devices may be volatile or non-volatile. Volatile memory cells (e.g., DRAM cells) may lose their programmed states over time unless they are periodically refreshed by an external power source. Non-volatile memory cells (e.g., NAND memory cells) may maintain their programmed states for extended periods of time even in the absence of an external power source.

Some memory may be configured to support compute express link (CXL), which is an open standard for connections between high-speed processors and devices or memory. In memory devices, including those using the CXL standard, errors may occur during reading or writing. In such instances error correction techniques may be used to correct the error.

BRIEF DESCRIPTION OF THE DRAWINGS

The accompanying drawings, which are incorporated herein and form part of the specification, illustrate the present disclosure and, together with the description, further serve to explain the principles of the present disclosure and to enable a person skilled in the relevant art(s) to make and use the present disclosure.

Additionally, the left-most digit of a reference number identifies the drawing in which the reference number first appears (e.g., a reference number "310" indicates that the element so numbered is first labeled or first appears in FIG. 3). Additionally, elements which have the same reference number, followed by a different letter of the alphabet or other distinctive marking (e.g., an apostrophe), indicate elements which may be the same in structure, operation, or form but may be identified as being in different states, locations in space, or recurring at different points in time (e.g., reference numbers "110$a$" and "110$b$" may indicate two different input devices which may functionally the same, but may be located at different points in a method, or "210'" and "210''" may indicate a device in different points in time).

FIGS. 13A and 13B illustrate an error state diagram of a memory transfer block during an iterative decoding, according to an embodiment of the present disclosure.

FIG. 15 is a flow diagram of an example method for iterative error correction decoding, according to an embodiment of the present disclosure.

Further embodiments, features, and advantages of the present disclosure, as well as the operation of the various embodiments of the present disclosure, are described below with reference to the accompanying figures.

DETAILED DESCRIPTION OF THE DISCLOSURE

While embodiments described herein are illustrative embodiments for particular applications, it should be understood that the disclosure is not limited thereto. Those skilled in the art with access to the teachings provided herein will recognize additional modifications, applications, and embodiments within the scope thereof and additional fields in which the disclosure would be of significant utility.

The embodiments described herein are referred in the specification as "one embodiment," "an embodiment," "an example embodiment," etc. These references indicate that the embodiment(s) described can include a particular feature, structure, or characteristic, but every embodiment does not necessarily include every described feature, structure, or characteristic. Further, when a particular feature, structure, or characteristic is described in connection with an embodiment, it is understood that it is within the knowledge of one skilled in the art to affect such feature, structure, or characteristic in connection with other embodiments whether or not explicitly described.

Some interfaces (e.g., the Compute Express Link ("CXL") interface) are designed to be used between a host system and one or more memory systems. For example, the memory systems may use memory coherently across the host system and memory system. In the event of a memory chip failure other system components may be used to protect the computer memory systems, which may also be referred to as chipkill protection in CXL devices. Such chipkill protection within this disclosure may be referred to as low power chip kill ("LPCK").

Various embodiments of the system and method are discussed below with reference to FIGS. 1-15. However, those skilled in the art will readily appreciate that the detailed description given herein with respect to these FIGS. is for explanatory purposes only and should not be construed as limiting.

Figure 1:
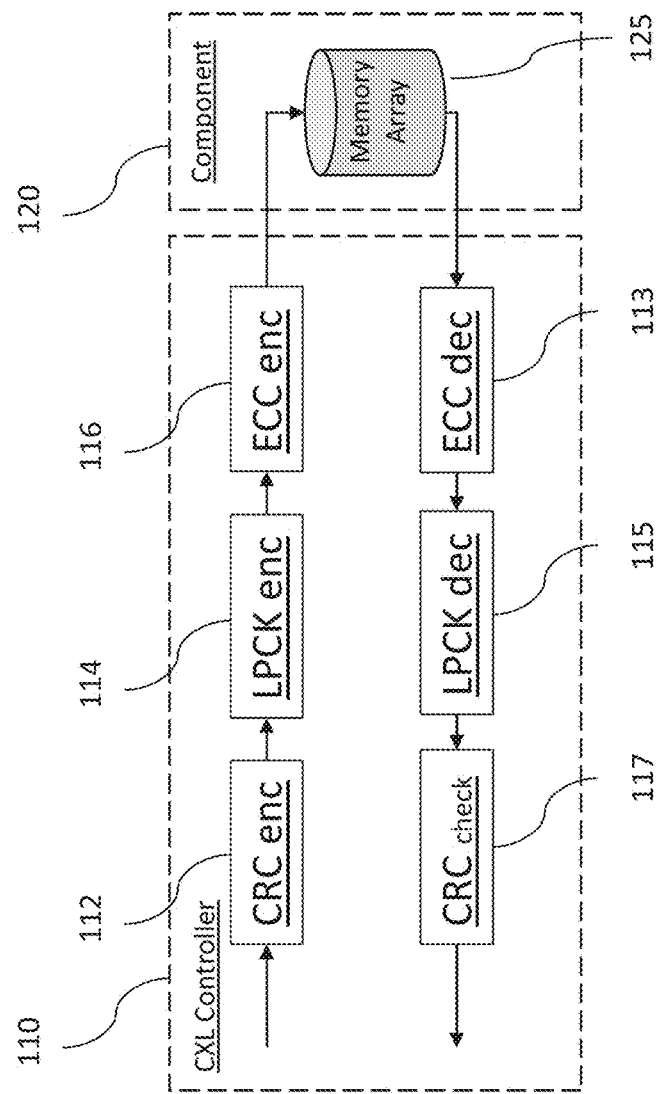
FIG. 1 illustrates a functional block diagram of a controller and a component containing a memory array, according to an embodiment of the present disclosure.

FIG. 1, illustrates an LPCK flow system 100, according to an embodiment. As shown in FIG. 1, LPCK flow system 100 may include a CXL controller 110 and a component 120. CXL controller 110 may include multiple encoders and multiple decoders, such as a CRC (cyclic redundancy check) encoder 112, an LPCK encoder 114, and an ECC (error correction code) encoder 116.

In an embodiment, the process of storing a memory transfer block (not shown) may include receiving the memory transfer block in the CXL controller 110 by a CRC encoder 112. CRC encoding typically receives a dataword and then generates additional bits, typically referred to as redundancy bits, to generate a codeword. The memory transfer block typically consists of a plurality of codewords with each codeword representing a row or column of data within the memory transfer block.

The memory transfer block is then passed to the LPCK encoder 114. The LPCK encoder 114 may use a non-binary hamming code implemented in software or circuits, e.g., hamming code logic, to encode the received data into a codeword. In an embodiment, the codeword generated by the LPCK encoder 114 is done on rows of data within the memory transfer block. Once encoded, the memory transfer block is passed to the ECC encoder 116.

The ECC encoder 116 uses a binary hamming code implemented in software or circuits, e.g., hamming code logic, on the received memory transfer block and generates an associated codeword typically based on columns of data within the memory transfer block. Further, a codeword may include data bits with additional components. The additional components may include CRC, ECC and LPCK parity bits. In addition, the additional components may include other data such as metadata and the like. The memory transfer block may then be passed to component 120 that may also include a memory array 125 that stores the memory transfer block.

In an embodiment, reading data such as the stored memory transfer block described above, a similar process is used. For example, a memory transfer block may be retrieved from the memory array 125 and forwarded to the ECC decoder 113. The received memory transfer block is first decoded using the ECC binary hamming code implemented in software or circuits, e.g., hamming code logic. As known by one of ordinary skill in the art, there are multiple types of ECC coding/decoding algorithms such as an ECC-1 algorithm that can detect and correct a single bit error and an ECC-2 algorithm that can detect and correct double bit errors. Accordingly, if ECC decoder 113 detects an error that it is capable of correcting, it will do so.

The output of the ECC decoder 113 is then passed to the LPCK decoder implemented in software or circuits, e.g., hamming code logic, which using a non-binary hamming code may be configured to detect and correct errors. Typically, the LPCK decoder 115 may be configured to detect and correct a symbol error where the symbol may consist of a word, e.g., multiple bits or a byte. The output of the LPCK decoder 115 may then be transferred to the CRC check 117 that may perform a CRC parity check with the stored CRC parity value within the codeword. The CRC check 117 is further protection against silent data corruption.

Figure 2:
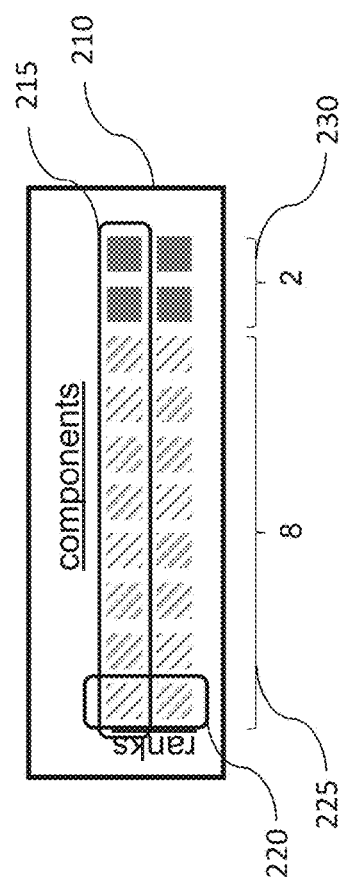
FIG. 2 illustrates a functional block diagram of a memory array, according to an embodiment of the present disclosure.

FIG. 2 illustrates a functional block diagram of a memory array 200 for storing a system memory transfer block, according to an embodiment. A system memory transfer block may be stored in an array of memory components shown as components 210. Components 210 may consist of multiple memory chip circuits, which may also be referred to as memory dies. Components 210 illustrate a layout of memory dies where each row of components may be referred to as a rank, for example the first row is rank 215.

Further, the set of components may be divided into columns as illustrated by column 220. Memory array 200 is shown as an example of an 8+2 layout where the eight columns shown as element 225 contain data. In an embodiment, each component may be configured to store 8 bits of information. However, each component may be configured to hold any amount of data, the configuration shown in FIG. 2 is merely illustrative.

In an embodiment, components 210 illustrate an 8+2 layout where the first eight columns, shown as element 225, contain data. The last two columns, shown as element 230 contain additional data, for example parity bits. Thus, the first eight components in rank 215 contain data with the rightmost two components in rank 215 contain parity bits generated from the first eight components in rank 215 containing data. While FIG. 2 may represent a single LPCK channel, any number of channels may be configured in a similar manner. In addition, multiple LPCK channels may work in a parallel configuration to increase bandwidth.

Figure 3:
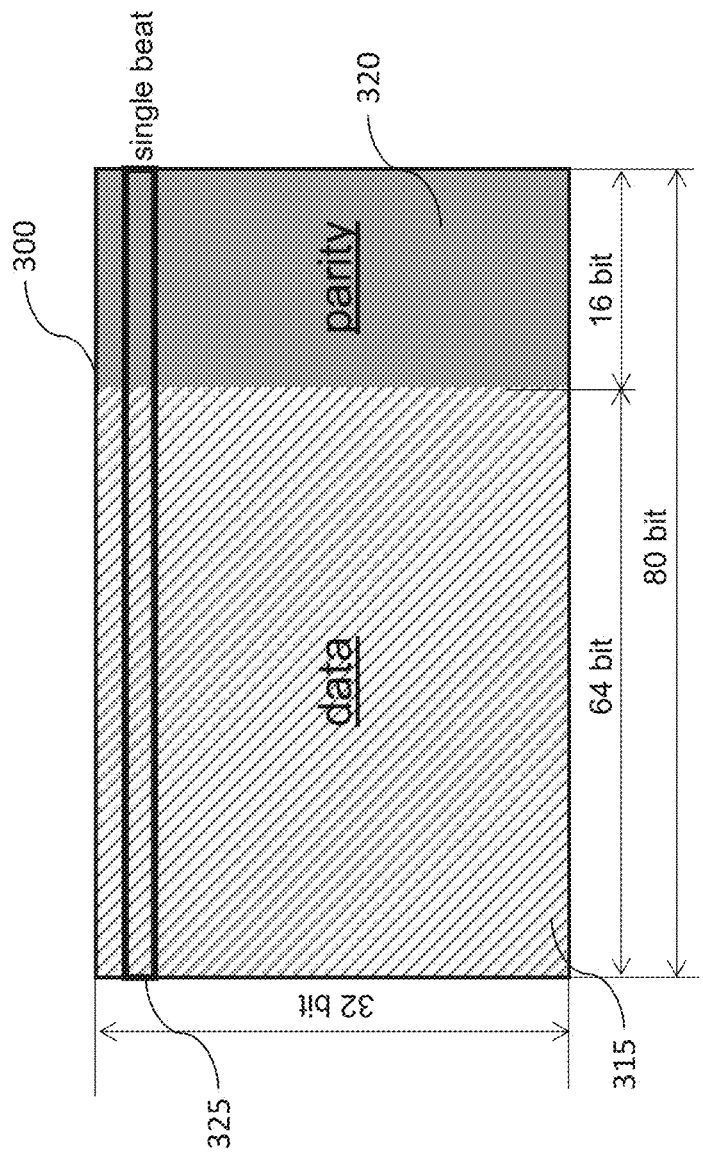
FIG. 3 illustrates a functional block diagram of a memory transfer block, according to an embodiment of the present disclosure.

FIG. 3 illustrates a functional block diagram of a memory transfer block 300, according to an embodiment. Memory transfer block 300 may include data information 315 and other information, such as parity 320. In an embodiment, the data information such as CRC, Metadata, KeyID, and Media Access Control (MAC) addresses, may be stored in an extra area of each component. Data may be accessed through "DQ" pads, while extra information may be accessed through DMI pads. In an embodiment, a standard DRAM device may include a single DMI pad for every eight DQ pads. For example, an ×8 mode components there may be eight DQ pads and a single DMI pad. Memory transfer block 300 includes multiple rows of data, each referred to as a single beat, with single beat 325 shown as an example. In an embodiment there are 32 rows in the memory transfer block 300 that may be referred to as a memory transfer block with a burst length of 32 bits. In this embodiment, each beat, or row of information contains 64 bits of data with another 16 bits of parity data, for a total of 80 bits within a single beat. In another embodiment the length of data and parity may take on any length as would be known by one of ordinary skill in the art. Thus, memory transfer block 300 is characterized as being 80 bits wide with a burst length of 32 bits.

Figure 4:
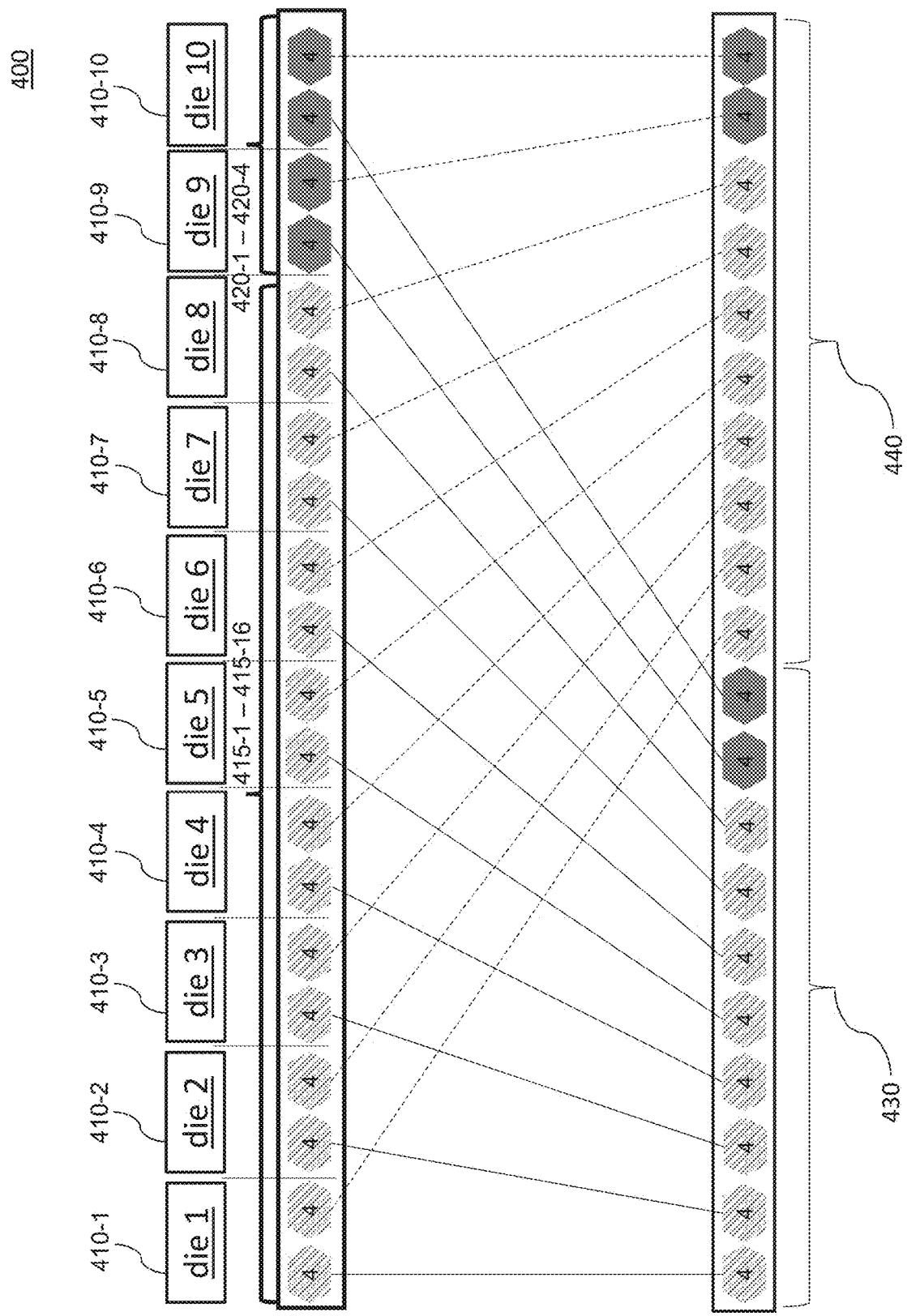
FIG. 4 illustrates a functional block diagram of a low power chip kill solution, according to an embodiment of the present disclosure.

FIG. 4 illustrates a functional block diagram of an LPCK solution system 400, according to an embodiment. LPCK system 400, in an embodiment, may include ten separate memory chip components shown as die 410-1 through 410-10 and also labeled die 1 through die 10. In an embodiment each die 410-1 through 410-10 may contain two 4-bit symbols. The data portion of a system memory transfer block may be shown as 4-bit symbols 415-1 through 415-16 contained in die 410-1 through 410-8.

Thus, for example, die 410-1 may contain 4-bit symbols 415-1 and 415-2, die 410-2 may contain 4-bit symbol 415-3 and 415-4, through to die 410-8 containing 4-bit symbols 415-15 and 415-16. Further, in this embodiment, the parity information of the system memory transfer block would be stored in die 410-9 and 410-10 containing the 4-bit symbols 420-1, 420-2, 420-3, and 420-4. Thus, die 410-9 may contain the 4-bit symbols 420-1 and 420-2 and die 410-10 may contain the 4-bit symbols 420-3 and 420-4. Note, in other embodiments, the 4-bit symbols 415 and 420 may be replaced with symbols containing other numbers of bits.

LPCK system 400, in an embodiment, generates codeword 430 and codeword 440 from the 4-bit symbols 415 and 420. These codewords may be used to detect and correct various errors in the system memory transfer block as will be discussed in further detail. Codeword 430 may be generated by using the first symbol of each die 410, for example symbol 415 and symbol 420. Thus, codeword 430 may contain the first 4-bit symbols of data represented by 415-1, 415-3, 415-5, 415-7, 415-9, 415-11, 415-13 and 415-15, and the first 4-bit symbols of parity represented by 420-1 and 420-3. In a similar fashion, codeword 440 may contain the second 4-bit symbols of data represented by 415-2, 415-4, 415-6, 415-8, 415-10, 415-12, 415-14 and 415-16, and the second 4-bit symbols of parity represented by 420-2 and 420-4.

Figure 5:
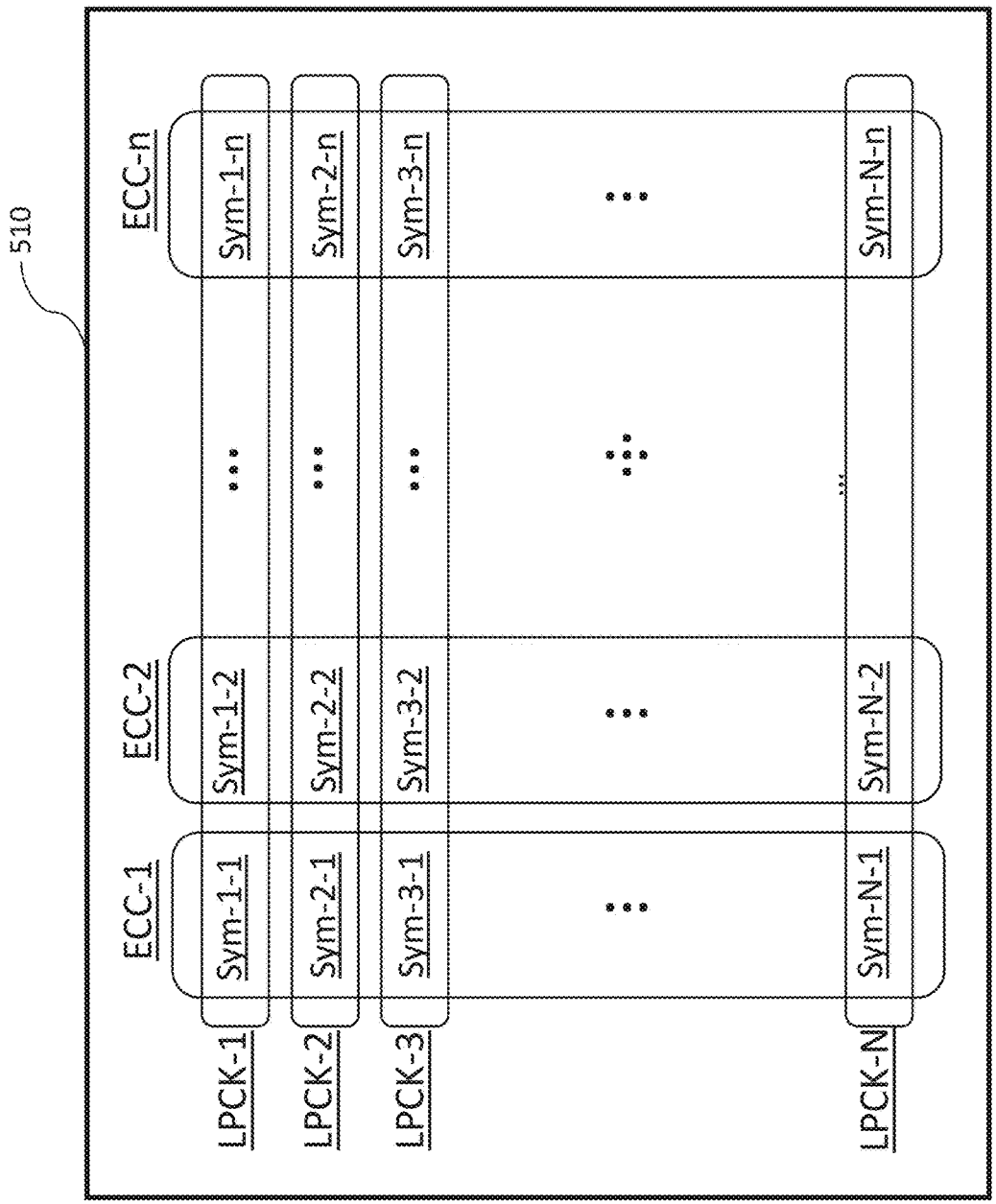
FIG. 5 illustrates a functional block diagram of codeword intertwining in a low power chip kill solution, according to an embodiment of the present disclosure.

FIG. 5 illustrates a functional block diagram of codeword intertwining in an LPCK solution system 500, according to an embodiment. LPCK system 500 may contain a memory transfer block 510, which as described in FIG. 3 may contain an array of data and parity bits. For example, the memory transfer block ("MTB") 510 may contain rows of data consisting of n bits, where each row consists of data bits, e.g., 64 bits, and an additional number of parity bits, e.g., 16 bits, of parity for a total of 80 bits. Further, the memory transfer block 510 may have a burst length of N, for example as shown in FIG. 3, where the burst length is 32 bits.

LPCK system 500 illustrates symbols, such as those described in FIG. 4. For example, LPCK-1 may include codewords in a horizontal partition of a memory transfer block such as codewords 430 and 440 derived from symbols Sym-1-1 through Sym-1-n. And, in a similar fashion, LPCK-2 may include codewords derived from Sym-2-1 through Sym-2-n, and so forth through LPCK-N with codewords derived from Sym-N-1 through Sym-N-n.

While the MTB 510 illustrates LPCK-1 through LPCK-N codewords based on a horizontal analysis of the data and parity, the memory transfer block 510 may also illustrate codewords based on an orthogonal or vertical analysis of the data and parity information. Thus, as shown, ECC codewords are generated using the symbols in a columnar fashion. For example, the ECC-1 codeword may use the symbols Sym-1-1 through Sym-N-1 where each symbol includes data and parity information. As will be discussed later, ECC algorithms typically may detect and correct single bit errors.

There are also ECC algorithms that can be used to correct double bit errors. Further, LPCK algorithms are configured to detect and correct single byte, e.g., eight bits, errors. Thus, the LPCK system 500 configuration depicted in FIG. 5 may be used to detect and correct single bit errors on the columns of information using an ECC algorithm and using LPCK algorithms to correct single-byte errors on a row by row or horizontal partition of the memory transfer block. Further, as shown, the intersection of a particular ECC codeword and a particular LPCK codeword is a single symbol. For example, the intersection of LPCK-3 and ECC-2 is the symbol Sym-3-2.

Figure 6:
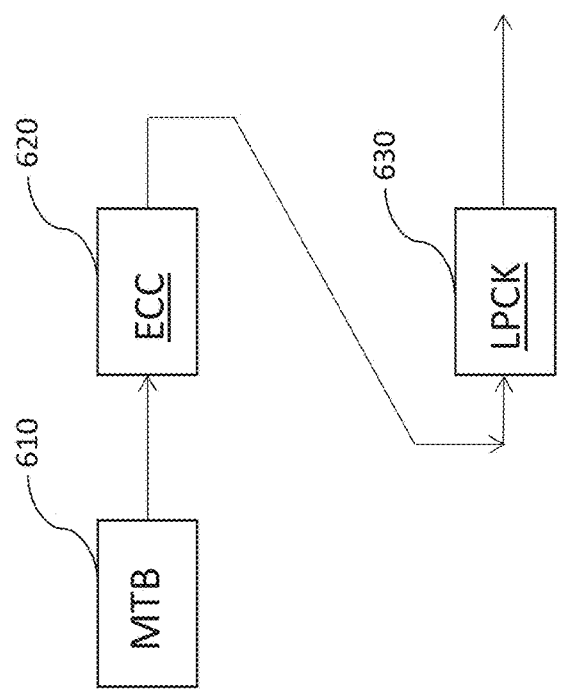
FIG. 6 illustrates a functional block diagram of a feed-forward low power chip kill decoder on a memory transfer block, according to an embodiment of the present disclosure.

FIG. 6 illustrates a feedforward LPCK decoder system 600, according to an embodiment. LPCK decoder system 600 illustrates the delivery of MTB 610 to an error correction code decoder 620 and an LPCK decoder 630. As previously discussed, a memory transfer block such as MTB 610 may consist of an amount of data plus redundancy data such as parity and/or metadata and can be of any size and configuration as known to one of ordinary skill in the art.

LPCK decoder system 600 preforms its error detection and correction in a serial fashion. For example, MTB 610 is received by ECC decoder 620 that performs an error detection and correction on the vertical portions of MTB 610. Once the ECC decoder 620 completes its detection and possible correction the MTB 610 is forwarded to the LPCK decoder 630 that performs a detection and possible correction on the horizontal portions of the MTB 610. Once completed the MTB 610 is output to a device (not shown) such as a storage array or other component.

The ECC decoder 620 may perform its detection and correction based on a binary hamming code on the received stream of data coming from each die, e.g., die 410, in the form of the MTB 610. The LPCK decoder 630 may perform its detection and correction based on the use of a non-binary hamming code working on a subset of burst beats, for example, the single beat 325 of FIG. 3. Also, note that the LPCK decoder system 600 operates in a serial manner, performing the ECC binary hamming code decoding first and then the LPCK non-binary hamming code decoding second.

Figure 7:
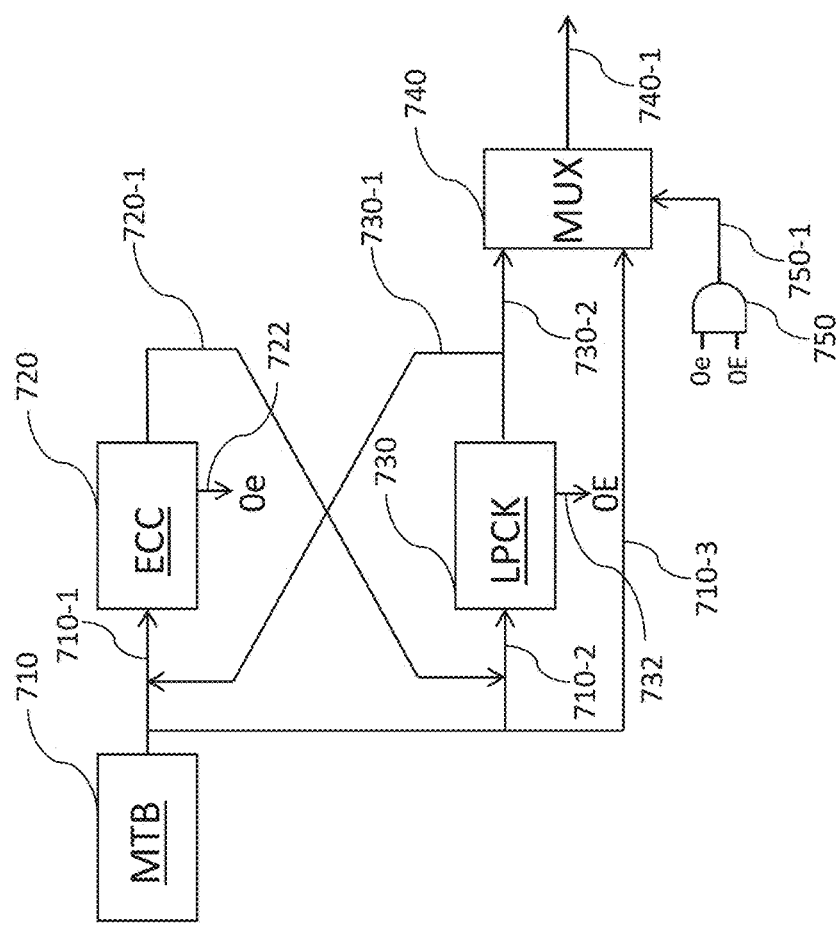
FIG. 7 illustrates a functional block diagram of a feed-forward low power chip kill decoder with a multiplexor on a memory transfer block, according to an embodiment of the present disclosure.

FIG. 7 illustrates a feedforward LPCK decoder system 700 with a multiplexor, according to an embodiment. LPCK decoder system 700 is configured to receive MTB 710 stream simultaneously via path 710-1 to an ECC decoder 720 and via path 710-2 to an LPCK decoder 730. The simultaneous receipt of the MTB 710 is in contrast to the serial receipt of the MTB 610 by the ECC decoder 620 and then by the LPCK decoder 630 as discussed in FIG. 6.

The ECC 720 may also include an error flag output 722, where in an embodiment, if an error is detected by the ECC decoder 720 in the MTB 710, the error flag output 722 is set to zero, e.g., Oe=0. Conversely if no error is detected by the ECC decoder 720 then the error flag output 722 is a one, e.g., Oe=1. In a similar fashion, the LPCK decoder 730 may also include an error flag output 732, where in an embodiment, if an error is detected by the LPCK decoder 730 in the MTB 710, the error flag output 732 is set to zero, e.g., OE=0.

Conversely if no error is detected by the LPCK decoder 730 then the error flag output 722 is a one, e.g., OE=1. The LPCK decoder system 700, by simultaneously receiving MTB 710 at both the ECC decoder 720 and LPCK decoder 730, may be able to each determine if the MTB 710 contains an error. Such an approach reduces the latency time to determine errors within MTB 710 in contrast to the feed-forward LPCK system 600 that detects errors serially.

The LPCK decoder system 700 may also contain multiple paths for forwarding the MTB 710. For example, paths 710-1 and 710-2 may be used to forward the MTB 710 to ECC 720 and LPCK decoder 730 simultaneously, or MTB 710 could be forwarded directly to the multiplexor MUX 740 via path 710-3. LPCK decoder system 700 may also include control logic for MUX 740, such as the AND logic 710 that shows as its input the error flag output 722 and the error flag output 732 that determine the AND output 750-1 that controls the selection of MUX 740. The various other paths along routing the MTB 710 stream to the various components in addition to iterative routing through the ECC decoder 720 and the LPCK decoder 730 as will be explained in more detail in FIGS. 8, 9, and 10.

Figure 8:
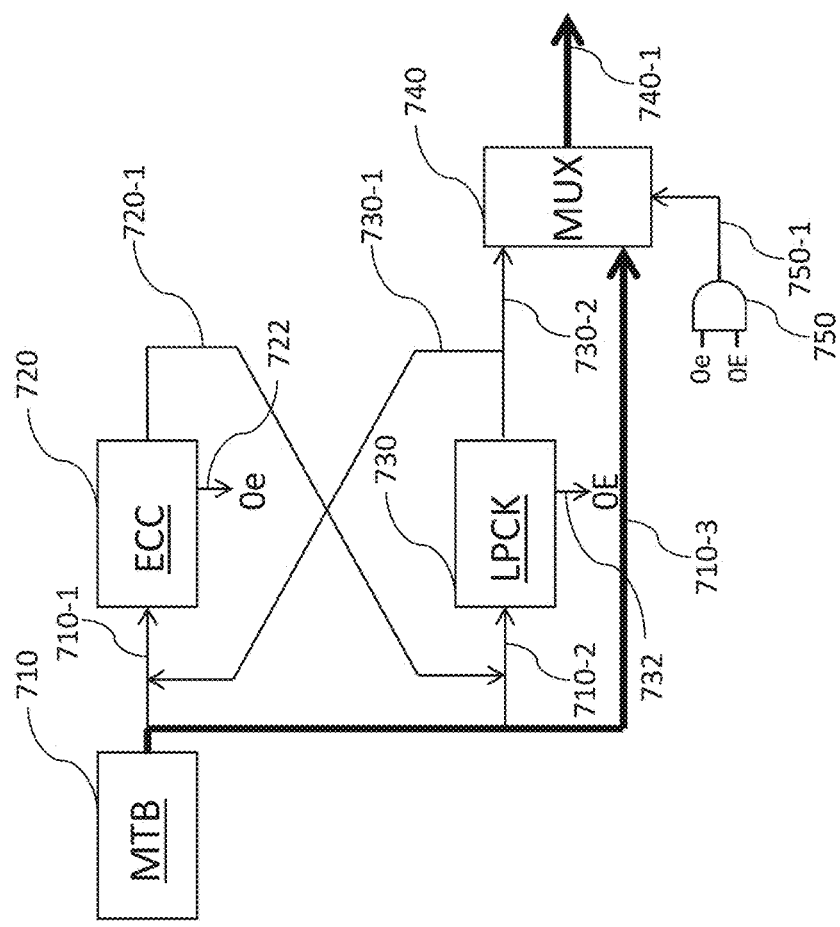
FIG. 8 illustrates a functional block diagram of a memory transfer block error correction system with a multiplexor illustrating a fast path decoding, according to an embodiment of the present disclosure.

FIG. 8 illustrates the LPCK decoder system 700 in the case of a fast path decoding, according to an embodiment. LPCK decoder system 700 may receive the MTB 710 where the ECC decoder 720 and the LPCK decoder 730 both determine, based on parity and/or other information contained within the MTB 710 stream that there are no errors. In such a situation, both the error flag output 722 and the error flag output 732 are both set to a logical "1", indicating that neither decoder detected an error in the MTB 710 stream. Thus, MUX 740 is enabled to pass the MTB 710 stream through path 710-3 and output the MTB 710 stream through output path 740-1. In this instance there is no need for further detection and decoding of the MTB 710 stream and thus there is virtually no delay or latency in forwarding the MTB 710 stream to a storage array or other component, such as a CXL device.

Figure 9:
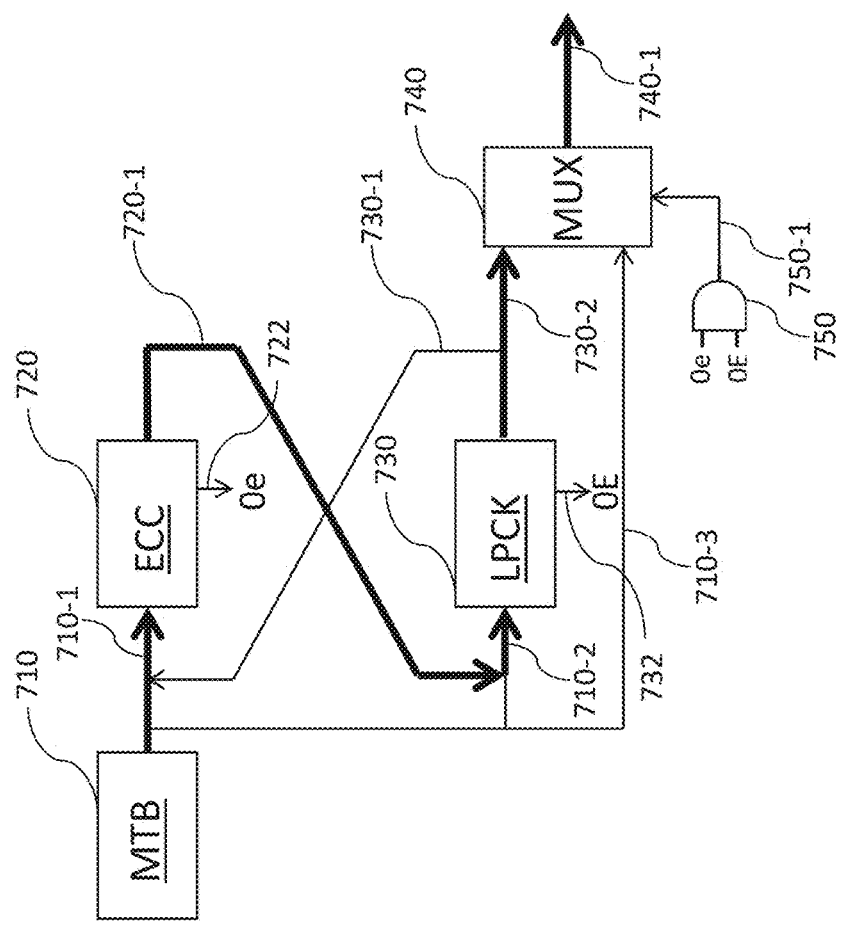
FIG. 9 illustrates a functional block diagram of a memory transfer block error correction system with a multiplexor illustrating a feedforward decoding path, according to an embodiment of the present disclosure.

FIG. 9 illustrates the LPCK decoder system 700 in the case of a standard feedforward path decoding, according to an embodiment. LPCK decoder system 700 may receive the MTB 710 where either, or both, of the ECC decoder 720 and the LPCK decoder 730 determine that there is an error in the MTB 710 stream. In such a situation the MTB 710 stream is routed through path 710-1 to ECC decoder 720 where the ECC decoder 720 detects and corrects, if possible, errors in the vertical portion of the MTB 710 stream. The output, which may be referred to as the MTB 710' stream is routed through path 720-1 and 710-2 to LPCK decoder 730. LPCK decoder 730 detects and correct, if possible, errors in the horizontal portion of the MTB 710' stream that is then output as the MTB 710" stream through path 730-2 and through MUX 740 and output path 740-1 to a storage array or other component.

Figure 10:
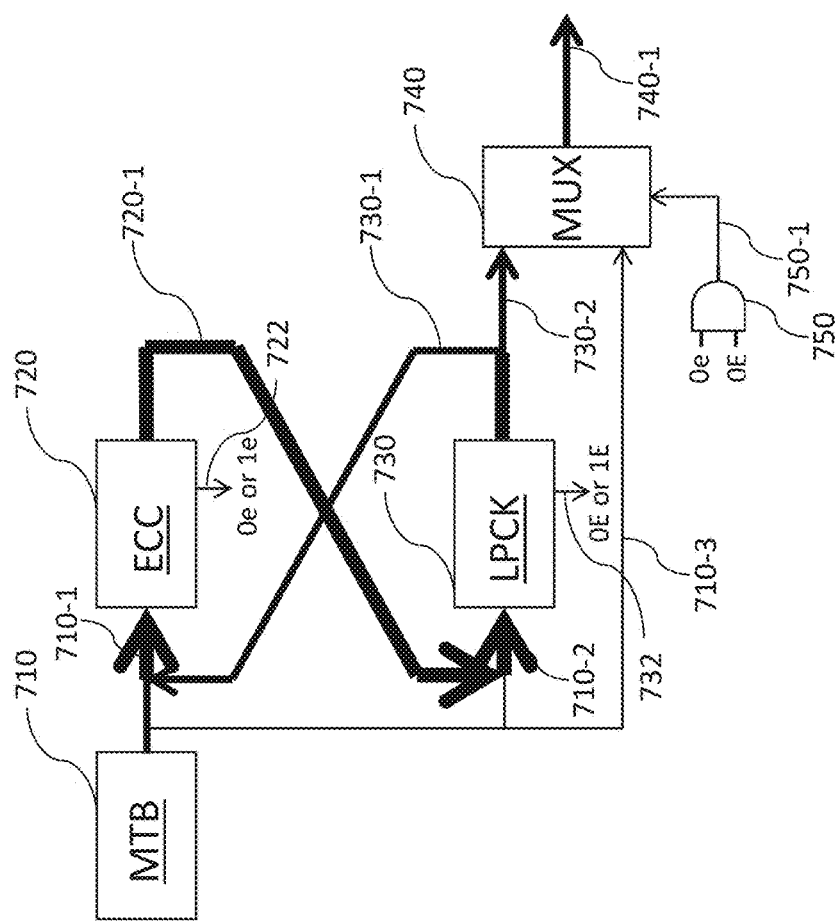
FIG. 10 illustrates a functional block diagram of a memory transfer block error correction system with a multiplexor illustrating an iterative decoding path, according to an embodiment of the present disclosure.

FIG. 10 illustrates the LPCK decoder system 700 in the case of an iterative decoding feedforward path, according to an embodiment. LPCK decoder system 700 may receive the MTB 710 stream where either, or both, of the ECC decoder 720 and the LPCK decoder 730 detects an error in the MTB 710 stream. If ECC decoder 720 detects an error, it will generate an initial error flag output 722, where 0e=0, or where LPCK decoder 730 detects an error and generates an initial error flag output 732, where 0E=0. As described in FIG. 9, ECC decoder 720 will process the MTB 710 stream and output a corrected, if possible, MTB 710' stream that is forwarded to LPCK decoder 730. LPCK decoder 730 will then process MTB 710' stream and output a corrected, if possible, MTB 710" stream.

At this point the system may determine if an iterative decoding cycle is appropriate. Thus, if the LPCK decoder 730 detects any errors in any horizontal portion of the MTB 710" stream, generating an error flag output 732 of 1E, or if ECC 720 detects any errors in a vertical portion of the MTB 710" stream, generating an error flag output 722 of 1e, then another iteration of decoding may be appropriate.

An iterative cycle would include forwarding the MTB 710" stream back to the ECC decoder 720 using path 730-1 and path 710-1. The ECC decoder 720 would then process MTB 710" stream and output a corrected, if possible, MTB 710''' stream that would be directed to the LPCK decoder 730 using path 720-1 and 710-2. The LPCK decoder would then, if possible, correct any remaining errors, and outputting MTB 710'''' to MUX 740 to output over path 740-1 to a storage array or component.

In some situations, as will be shown in FIG. 14, the ECC decoder 720 and the LPCK decoder 730 may not be capable of correcting all of the errors in the MTB 710'''' stream. In such a case the MTB would be considered "poisoned" with the error correction process stalling, meaning that all errors could not be corrected and that further iterative processing would not resolve the errors. In such a situation, further action may be required.

Figure 11:
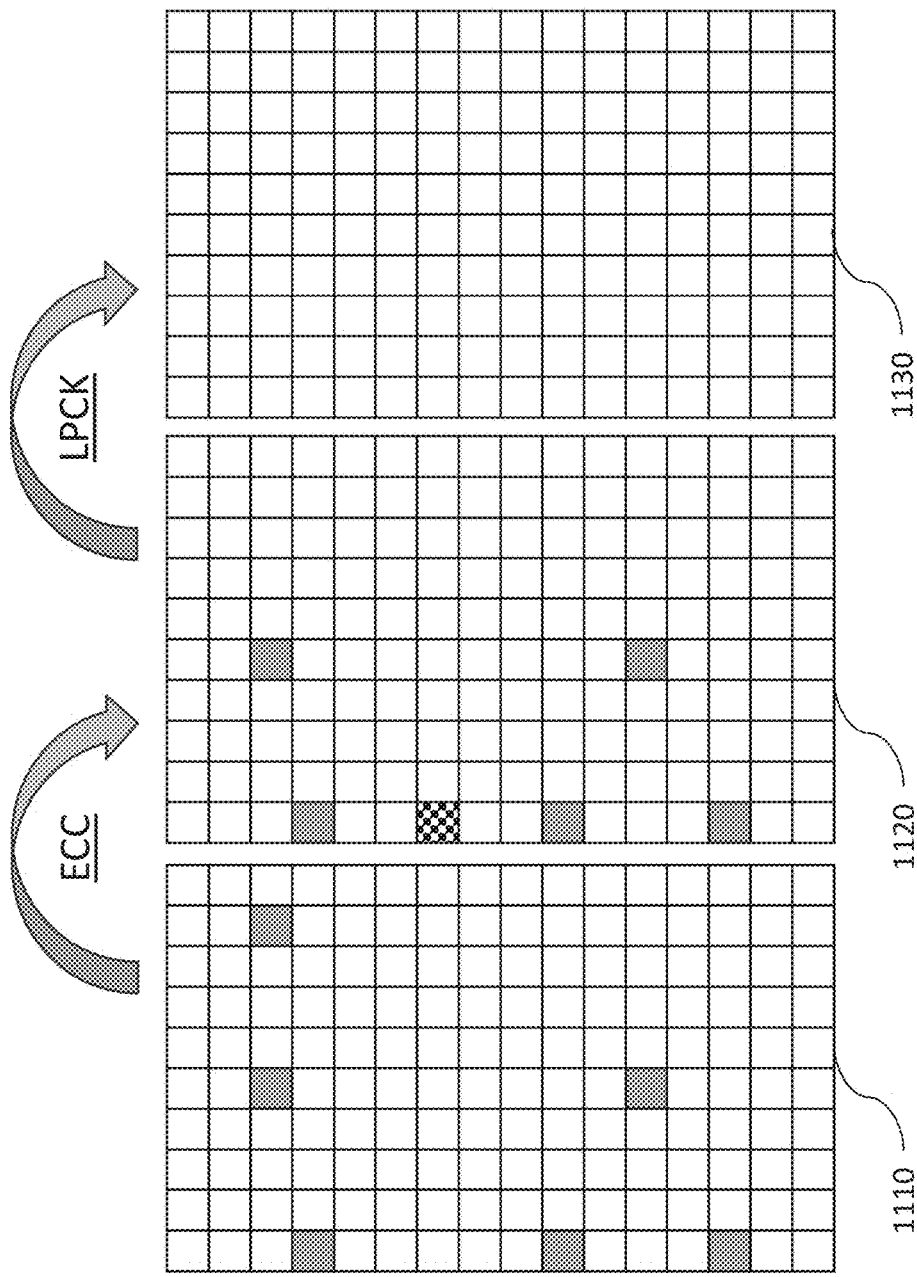
FIG. 11 illustrates an error state diagram of a memory transfer block during decoding, according to an embodiment of the present disclosure.

FIG. 11 illustrates an error state diagram 1100 of a memory transfer block during decoding, according to an embodiment. Block 1110 represents an initial MTB stream. The horizontal rows illustrate an LPCK codeword and the vertical rows illustrate ECC codewords. The example shown uses a 10×16 array, but this is for illustrative purposes only and could be of any size. Block 1110 indicates that there are detected errors in rows 3, 4, 10, 12, and 14. Block 1110 also indicates that these errors are located in columns 1, 5, and 9. Note that there are multiple errors in row 3 and multiple errors in columns 1 and 5. In this embodiment the ECC algorithm being used can only correct 1 bit errors, thus if a column contains multiple errors, the ECC algorithm will not be able to correct all the errors. Further, in some situations the ECC algorithm in correcting some errors may generated one or more additional error.

Block 1120 illustrates the results of processing the initial MTB stream, corresponding to the MTB 710' stream and processed by ECC decoder 720 discussed in FIGS. 7-10. Note that the ECC decoder was able to correct the single bit error in column 9, but was unable to correct the multiple bit errors in columns 1 and 5. Further, an additional error was generated in column 1, row 7, indicated by the checkerboard pattern. Further note that the remaining errors, while the columns contain multiple errors, all of the errors are in different rows.

Block 1130 illustrates the results of processing the MTB stream output from the ECC decoder by the LPCK decoder, corresponding to the MTB 710" stream. As there are no multiple errors in any of the rows of the MTB, the LPCK decoder can correct the errors, generating a clear state as shown in block 1130. Thus, this a case that could be corrected in a standard feedforward path decoding as shown in FIG. 9.

Figure 12A:
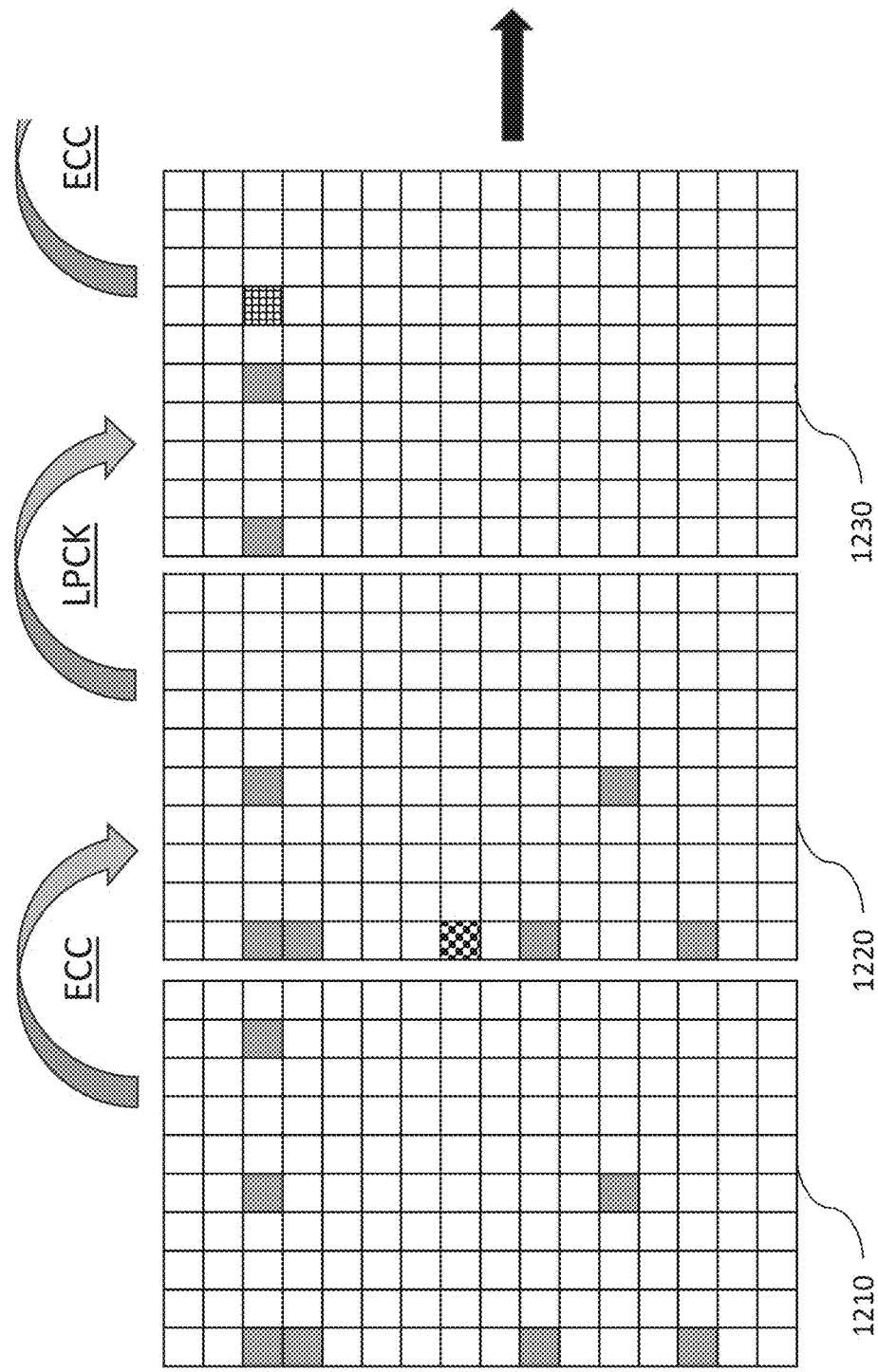
FIGS. 12A and 12B illustrate an error state diagram of a memory transfer block during an iterative decoding, according to an embodiment of the present disclosure.

FIG. 12A illustrates an error state diagram 1200 of a memory transfer block during decoding, according to an embodiment. Block 1210 represents an initial MTB stream with errors in columns 1, 5, and 9. These errors are located in rows 3, 4, 10, 12, and 14. The MTB stream is first processed by the ECC decoder that corrects any single errors in a column. Therefore, as shown in block 1220, corresponding to the MTB 710' stream, the single column error in column 9 is corrected. However, in the process of attempting to correct the errors in column 1, an additional error was generated in row 8 as indicated by the checkerboard pattern.

Figure 12B:
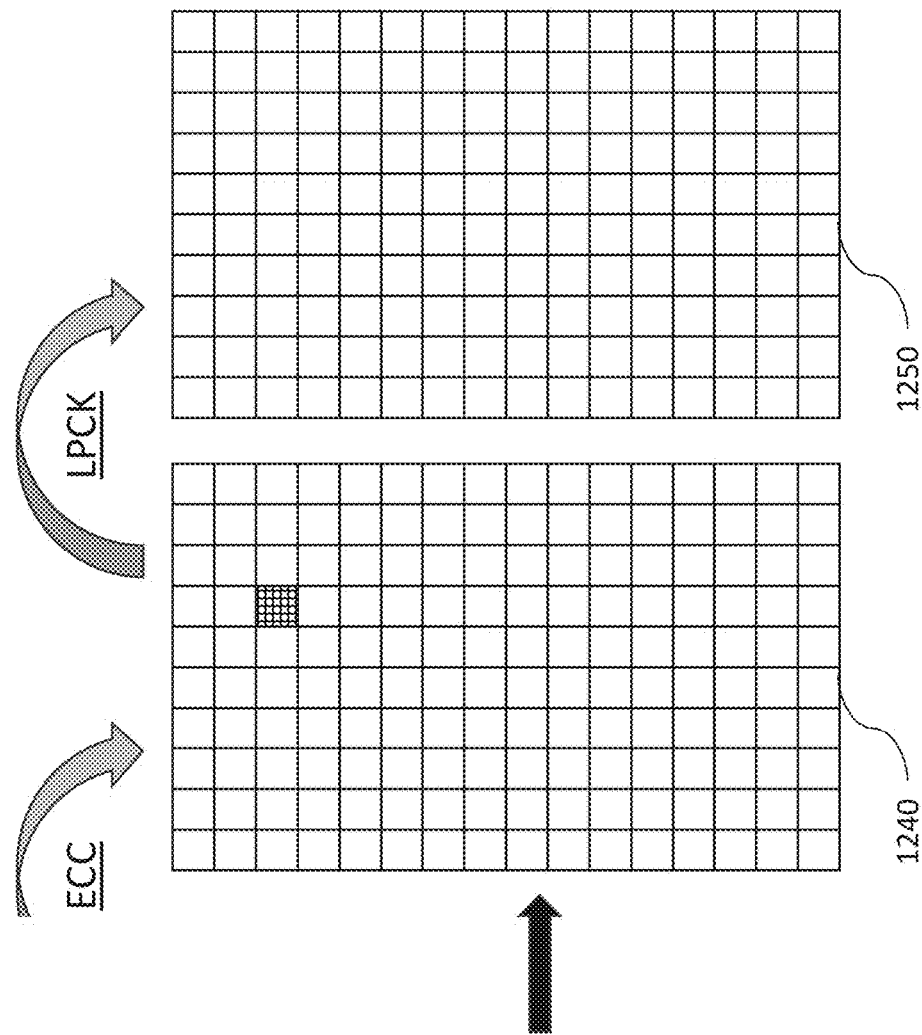

Block 1230 illustrated the results of processing the MTB stream output from the ECC decoder by the LPCK decoder, corresponding to the MTB 710" stream. The LPCK decoder was able to correct the single byte errors in rows 4, 8, 10, 12, and 14. However, the LPCK decoder was not able to correct the multiple errors in row 3 and in fact generated an additional error in row 3, column 7. Also, note that the additional error generated by the LPCK decoder is not a single bit, but rather a byte as the LPCK decoder works at the byte level rather that the bit level as the ECC decoder does. Accordingly, as block 1230 does not represent a clear state, the MTB stream is forwarded for an iterative decoding cycle wherein the MTB stream is sent back to the ECC decoder as is depicted in FIG. 12B.

Block 1240 represents the output of the ECC decoder, corresponding to the MTB 710''' stream discussed in FIG. 10. Note the ECC decoder may correct the single bit errors in columns 1 and 5, but not the byte error in column 7. However, when the output of the ECC decoder is processed by the LPCK decoder the byte, or symbol, error is corrected generating a clear state shown in block 1250, corresponding to the MTB 710"" stream.

Figure 13A:
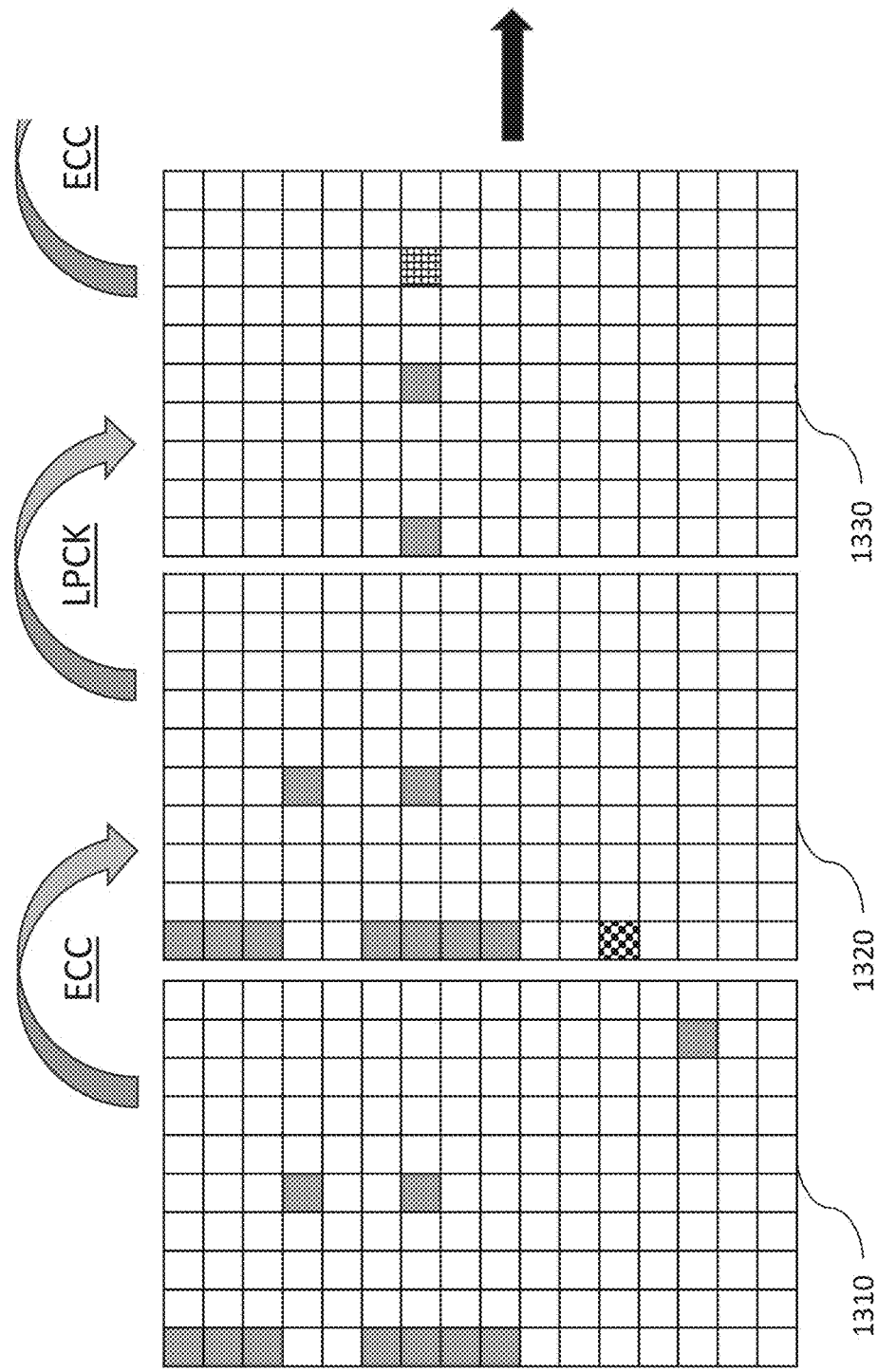

FIG. 13A illustrates an error state diagram 1300 of a memory transfer block during decoding, according to an embodiment. Block 1310 represents an initial MTB stream with errors in columns 1, 5, and 9. These errors are located in rows 1, 2, 3, 4, 6, 7, 8, 9, and 14. The MTB stream is first processed by the ECC decoder that corrects any single errors in a column. Therefore, as shown in block 1320, corresponding to the MTB 710' stream, the single column error in column 9 is corrected. However, in the process of attempting to correct the errors in column 1, an additional error was generated in row 12 as indicated by the checkerboard pattern.

Block 1330 illustrated the results of processing the MTB stream output from the ECC decoder by the LPCK decoder corresponding to the MTB 710" stream. The LPCK decoder was able to correct the single byte errors in rows 1, 2, 3, 4, 6, 8, 9, and 12. However, the LPCK decoder was not able to correct the multiple errors in row 7 and in fact generated an additional error in row 7, column 8. Also, note that the additional error generated by the LPCK decoder is not a single bit, but rather a byte as the LPCK decoder works at the byte level rather that the bit level as the ECC decoder does. Accordingly, as block 1330 does not represent a clear state, the MTB stream is forwarded for an iterative decoding cycle wherein the MTB stream is sent back to the ECC decoder as is depicted in FIG. 13B.

Block 1340 represents the output of the ECC decoder, corresponding to the MTB 710''' stream discussed in FIG. 10. Note the ECC decoder may correct the single bit errors in columns 1 and 5, but not the byte error in column 8. Further, in performing the correction, an additional bit error was generated in column 7. However, when the output of the ECC decoder is processed by the LPCK decoder the byte, or symbol, error and the bit error are corrected generating a clear state shown in block 1350 corresponding to the MTB 710"" stream.

Figure 14A:
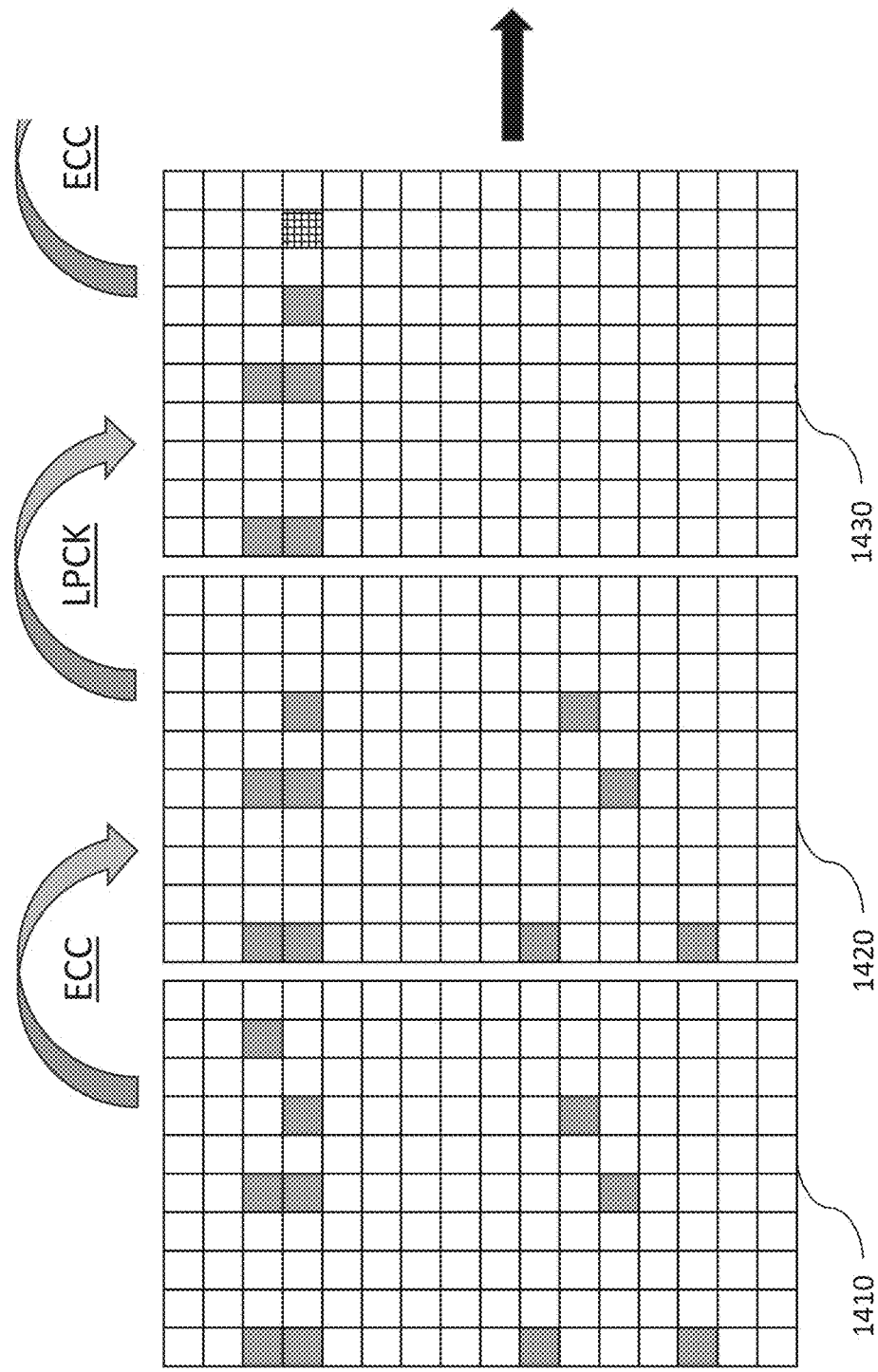
FIGS. 14A and 14B illustrate an error state diagram of a memory transfer block during an iterative decoding with error stalling, according to an embodiment of the present disclosure.

FIG. 14A illustrates an error state diagram 1400 of a memory transfer block during decoding, according to an embodiment. Block 1410 represents an initial MTB stream with errors in columns 1, 5, 7, and 9. These errors are located in rows 3, 4, 10, 11, 12, and 14. The MTB stream is first processed by the ECC decoder that corrects any single errors in a column. Therefore, as shown in block 1420 only the single column error in column 9 is corrected, corresponding to the MTB 710' stream.

Figure 14B:
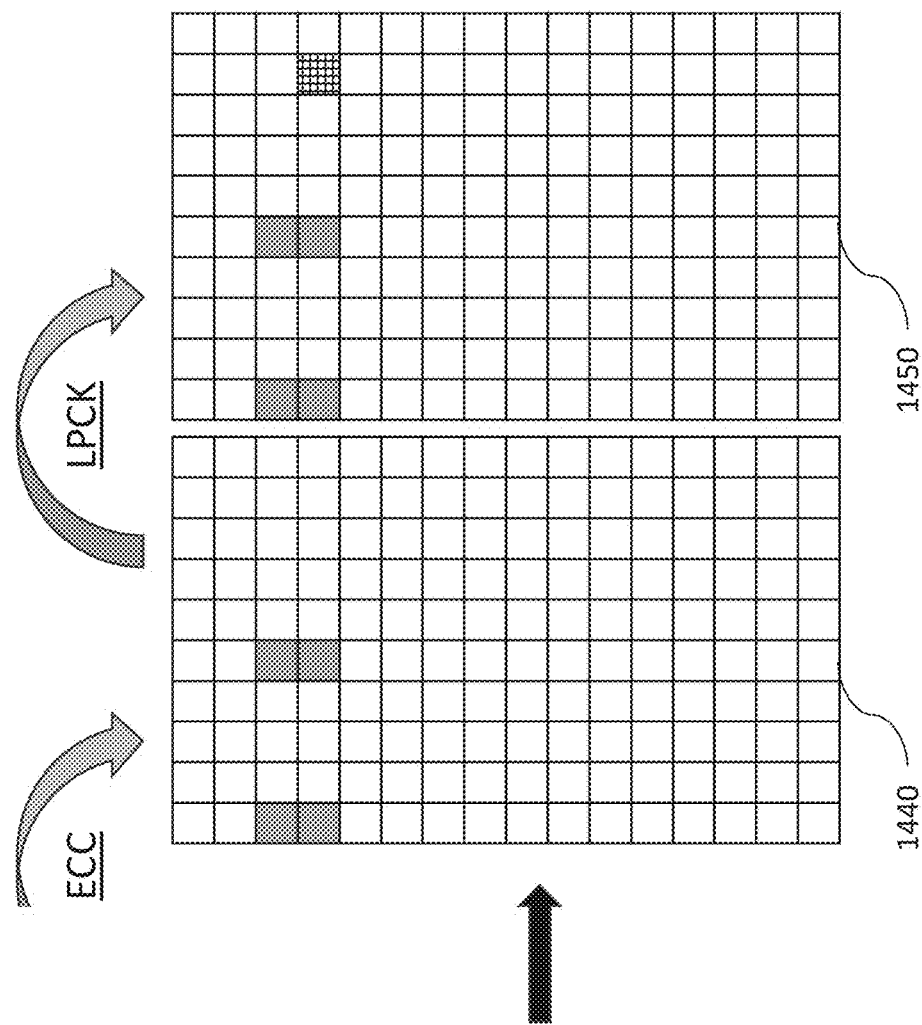

Block 1430 illustrated the results of processing the MTB stream output from the ECC decoder by the LPCK decoder, corresponding to the MTB 710" stream. The LPCK decoder was able to correct the single byte errors in rows 10, 11, 12 and 14. However, the LPCK decoder was not able to correct the multiple errors in rows 3 and 4 and in fact generated an additional error in row 4, column 9. Also, note that the additional error generated by the LPCK decoder is not a single bit, but rather a byte as the LPCK decoder works at the byte level rather that the bit level as the ECC decoder does. Accordingly, as block 1430 does not represent a clear state, the MTB stream is forwarded for an iterative decoding cycle wherein the MTB stream is sent back to the ECC decoder as is depicted in FIG. 14B.

Block 1440 represents the output of the ECC decoder, corresponding to the MTB 710''' stream. Note the ECC decoder may correct the single bit error in column 7, but not the multiple errors in columns 1 and 5 or the byte error in column 9. However, when the output of the ECC decoder is processed by the LPCK decoder there are only multiple error rows, as shown in rows 3 and 4. Thus, block 1450, corresponding to the MTB 710"" stream, fails to illustrate a clear state and the MTB is classified as poisoned where further processing by the ECC decoder and the LPCK decoder would fail to resolve the errors.

FIG. 15 shows an exemplary embodiment of a method 1500 for detecting and correcting memory errors. Method 1500 begins at step 1505 with the receiving, into a decoder, a memory transfer block, wherein the MTB comprises data and parity information, and wherein the MTB is arranged in a first dimension and a second dimension. For example, as discussed in FIG. 7, LPCK decoder system 700 is configured to receive the MTB 710 stream via path 710-1 to the ECC decoder 720 and via the path 710-2 to the LPCK decoder 730. Further, as discussed in FIG. 5, the MTB 510 illustrates codewords based on a horizontal analysis, e.g., a first dimension, of the data and parity and an orthogonal or vertical analysis, e.g., a second dimension, of the data and parity information.

Step 1510 includes performing an error checking and a correction function on the MTB using a binary hamming code logic within the decoder in the first dimension. As discussed regarding FIG. 1, the ECC encoder that may be implemented in software or circuits, may use a binary hamming code on the received memory transfer block and generates an associated codeword typically based on columns of data within the memory transfer block. Further, a memory transfer block may be retrieved from the memory array 125 and forwarded to the ECC decoder 113 where the received memory transfer block is first decoded using the ECC binary hamming code, again that may be implemented in software or circuits.

Step 1515 includes performing an error checking and a correction function on the MTB using a non-binary hamming code logic within the decoder in the second dimension.

As discussed regarding FIG. 1, the LPCK decoder may be implemented in software or circuits and may use a non-binary hamming code that may be configured to detect and correct errors typically based on rows of data within the memory transfer block. Further, as discussed regarding FIG. 5, the LPCK system 500 configuration may be used to detect and correct single bit errors on the column of information using an ECC algorithm and using LPCK algorithms to correct single-byte errors of a row or horizontal partition of the memory transfer block.

Step 1520 includes wherein the binary hamming code logic and the non-binary hamming code logic perform the error checking on the MTB simultaneously. As discussed regarding FIG. 7, the LPCK decoder system 700 is configured to receive a memory transfer block simultaneously via path 710-1 to an ECC decoder 720 and via path 710-2 to LPCK decoder 730. It is noted that the simultaneous receipt of the MTB 710 is in contrast to the serial receipt of the MTB 610 by the ECC decoder 620 and the subsequent receipt of the output of the ECC decoder 620 to the LPCK decoder 630 as shown in FIG. 6.

Step 1525 includes generating a first codeword based on a vertical partition of the MTB using the binary hamming code logic and generating a second codeword based on a horizontal partition of the MTB using the non-binary hamming code logic. As discussed regarding FIG. 5, MTB 510 illustrates LPCK-1 through LPCK-N codewords based on a horizontal analysis of the data and parity of the memory transfer block 510. MTB 510 also illustrates codewords based on an orthogonal or vertical analysis of the data and parity information. Thus, as shown, ECC codewords are generated using the symbols in a column fashion and LPCK codewords are generated using the symbols in horizontal or row fashion.

Step 1530 illustrates determining, upon initial receipt of the MTB if either the binary hamming code logic or the non-binary hamming code logic, that the MTB contains one or more initial errors, and that performs an initial decoding including forwarding the MTB to the binary hamming code logic for correction of errors, outputting a MTB' from the binary hamming code logic, forwarding the MTB' to the non-binary hamming code logic for correction of errors, and outputting a MTB" from the non-binary hamming code logic. As discussed regarding FIG. 9, the LPCK decoder system 700 illustrates a case of a standard feedforward path decoding.

The LPCK decoder system 700 may receive the MTB 710 where either, or both, of the ECC decoder 720 and the LPCK decoder 730 determine that there is an error in the MTB 710 stream. In such a situation the MTB 710 stream is routed through path 710-1 to ECC decoder 720 where the ECC decoder 720 detects and corrects, if possible, errors in the vertical portion of the MTB 710 stream. The output, which may be referred to as the MTB 710' stream is routed through path 720-1 and 710-2 to LPCK decoder 730. LPCK decoder 730 detects and correct, if possible, errors in the horizontal portion of the MTB 710' stream that is then output as the MTB 710" stream through path 730-2 and through MUX 740 and output path 740-1 to a storage array or other component.

Step 1535 illustrates iterative decoding that includes determining, after the MTB" is output from the non-binary hamming code logic, if either the binary hamming code logic or the non-binary hamming code logic determines that the MTB" still contains a remaining or a new error, then the decoding process continues by performing an iterative decoding including directing the MTB" back to the binary hamming code logic for correction, outputting a MTB''' from the binary hamming code logic, forwarding the MTB''' to the non-binary hamming code logic for correction, outputting a MTB'''' from the non-binary hamming code logic to a multiplexor; and outputting the MTB'''' from the multiplexor to a CXL component.

As discussed, an iterative cycle would include forwarding the MTB 710" stream back to the ECC decoder 720 using path 730-1 and path 710-1. The ECC decoder 720 would then process MTB 710" stream and output a corrected, if possible, MTB 710''' stream that would be directed to the LPCK decoder 730 using path 720-1 and 710-2. The LPCK decoder would then, if possible, correct any remaining errors, and outputting MTB 710'''' to MUX 740 to output over path 740-1 to a storage array or component.

The description and abstract sections may set forth one or more but not all exemplary embodiments of the present disclosure as contemplated by the inventor(s), and thus, are not intended to limit the present disclosure and the appended claims in any way.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries may be defined so long as the specified functions and relationships thereof may be appropriately performed.

The foregoing description of the specific embodiments will so fully reveal the general nature of the disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present disclosure should not be limited by any of the above-described exemplary embodiments.

Exemplary embodiments of the present disclosure have been presented. The disclosure is not limited to these examples. These examples are presented herein for purposes of illustration, and not limitation. Alternatives (including equivalents, extensions, variations, deviations, etc., of those described herein) will be apparent to persons skilled in the relevant art(s) based on the teachings contained herein. Such alternatives fall within the scope and spirit of the disclosure.

The disclosure contained herein includes, for example, Example 1 is an apparatus relating to memory detection and correction including a decoder configured to receiving a memory transfer block (MTB), wherein the MTB comprises data and parity information, wherein the MTB is arranged in a first dimension and a second dimension. The binary hamming code logic within the decoder may be configured to perform an error checking and a correction function on the MTB in the first dimension. The non-binary hamming code logic within the decoder may be configured to perform an error checking and a correction function on the MTB in the second dimension. Further, the binary hamming code logic and the non-binary hamming code logic are configured to perform the error checking on the MTB simultaneously.

An Example 2 is an apparatus of any preceding clause wherein the binary hamming code logic comprises an ECC logic and the non-binary hamming code logic comprises an LPCK logic. An Example 3 is an apparatus of any preceding clause wherein the binary hamming code logic is further configured to generate a codeword based on a vertical partition of the MTB. An Example 4 is an apparatus of any preceding clause wherein the non-binary hamming code logic is further configured to generate a codeword based on a horizontal partition of the MTB.

An Example 5 is an apparatus of any preceding clause wherein if the binary hamming code logic and the non-binary hamming code logic each determine, upon receipt of the MTB, that the MTB contains no memory errors the decoder further comprises a multiplexor that forwards the MTB directly to a CXL component bypassing the binary hamming code logic and the non-binary hamming code logic. An Example 6 is an apparatus of any preceding clause wherein the MTB further comprises Metadata.

An Example 7 is an apparatus of any preceding clause wherein if either the binary hamming code logic or the non-binary hamming code logic determines, upon receipt of the MTB, that the MTB contains one or more initial errors the MTB is fed forward to the binary hamming code logic, modified by the binary hamming code logic and output as a MTB', wherein the MTB' is fed forward to the non-binary hamming code logic, and modified by the non-binary hamming code logic and output as a MTB".

An Example 8 is an apparatus of any preceding clause wherein if either the binary hamming code logic or the non-binary hamming code logic determines, after the MTB" is output from the non-binary hamming code logic, that the MTB" still contains a remaining or a new error, an iterative decoding is performed by directing the MTB" back to the binary hamming code logic, modified by the binary hamming code logic and output as a MTB''', and wherein the MTB''' is fed forward to the non-binary hamming code logic, modified and output from the non-binary hamming code logic as a MTB"" to a multiplexor and output from the multiplexor to a CXL component.

An Example 9 is an apparatus of any preceding clause wherein if the non-binary hamming code logic and the binary hamming code logic determine that the MTB" contains no errors, then the MTB" is output to a multiplexor and output from the multiplexor to a CXL component. An Example 10 is an apparatus of any preceding clause wherein the MTB"" output to the multiplexor is determined by either the binary hamming code logic and/or the non-binary hamming code logic to contain plurality of errors then the MTB"" is identified as poison.

An Example 11 is an apparatus of any preceding clause wherein the binary hamming code logic is configured to correct single bit errors. An Example 12 is an apparatus of any preceding clause wherein the non-binary hamming code logic is configured to correct single byte errors.

The disclosure contained herein may include a method, for example, an Example 13 for memory error detection and recovery, comprising receiving, into a decoder, a MTB, wherein the MTB comprises data and parity information, wherein the MTB is arranged in a first dimension and a second dimension. The method includes performing an error checking and a correction function on the MTB using a binary hamming code logic within the decoder in the first dimension.

The method also includes performing an error checking and a correction function on the MTB using a non-binary hamming code logic within the decoder in the second dimension. Further, the method includes where the binary hamming code logic and the non-binary hamming code logic perform the error checking on the MTB simultaneously.

An Example 14 is a method of any preceding clause wherein the binary hamming code logic comprises an ECC logic and the non-binary hamming code logic comprises an LPCK logic. An Example 15 is a method of any preceding clause wherein the method may further comprise generating a codeword based on a vertical partition of the MTB using the binary hamming code logic.

An Example 16 is a method of any preceding clause wherein the method may further comprise generating a codeword based on a horizontal partition of the MTB using the non-binary hamming code logic. An Example 17 is a method of any preceding clause wherein the method may further comprise forwarding the MTB directly to a CXL component, bypassing the binary hamming code logic and the non-binary hamming code logic, if the binary hamming code logic and the non-binary hamming code logic each determine, upon receipt of the MTB, that the MTB contains no memory errors.

An Example 18 is a method of any preceding clause wherein the method may further comprise, upon initial receipt of the MTB, if either the binary hamming code logic or the non-binary hamming code logic determines that the MTB contains one or more initial errors, performs an initial decoding comprising forwarding the MTB to the binary hamming code logic, outputting a MTB' from the binary hamming code logic, forwarding the MTB' to the non-binary hamming code logic, and outputting a MTB" from the non-binary hamming code logic.

An Example 19 is a method of any preceding clause wherein the method may further comprise, determining, after the MTB is output from the non-binary hamming code logic, if either the binary hamming code logic or the non-binary hamming code logic determines that the MTB still contains a remaining or a new error, performing an iterative decoding comprising, directing the MTB" back to the binary hamming code logic, outputting a MTB''' from the binary hamming code logic, forwarding the MTB''' to the non-binary hamming code logic, outputting a MTB"" from the non-binary hamming code logic to a multiplexor, and outputting the MTB"" from the multiplexor to a CXL component.

An Example 20 is a method of any preceding clause wherein if the non-binary hamming code logic and the binary hamming code logic determine that the MTB" contains no errors, then the MTB" is output to a multiplexor and output from the multiplexor to a CXL component.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
   a decoding system configured to receive a memory transfer block (MTB) (i) comprising data and parity information and (ii) having a vertical portion and a horizontal portion, the decoding system comprising;

a first decoder including binary hamming code logic configured to perform error detection and correction on the vertical portion of the MTB; and a second decoder including non-binary hamming code logic configured to perform error detection and correction on the horizontal portion of the MTB;

wherein the first and second decoders are configured to perform the error detection and correction on the vertical and horizontal portions of the MTB simultaneously.

2. The apparatus of claim 1, wherein the binary hamming code logic comprises an error correction coding (ECC) logic and the non-binary hamming code logic comprises a low power chip kill (LPCK) logic.

3. The apparatus of claim 1, wherein if the binary hamming code logic and the non-binary hamming code logic each determine, upon receipt of the MTB, that the MTB contains no memory errors the decoder further comprises a multiplexor that forwards the MTB directly to a CXL component bypassing the binary hamming code logic and the non-binary hamming code logic.

4. The apparatus of claim 1, wherein the MTB further comprises Metadata.

5. The apparatus of claim 1, wherein if either the binary hamming code logic or the non-binary hamming code logic determines, upon receipt of the MTB, that the MTB contains one or more initial errors the MTB is fed forward to the binary hamming code logic, modified by the binary hamming code logic and output as a MTB', wherein the MTB' is fed forward to the non-binary hamming code logic, and modified by the non-binary hamming code logic and output as a MTB".

6. The apparatus of claim 5, wherein if either the binary hamming code logic or the non-binary hamming code logic determines, after the MTB" is output from the non-binary hamming code logic, that the MTB" still contains a remaining or a new error, an iterative decoding is performed by directing the MTB" back to the binary hamming code logic, modified by the binary hamming code logic and output as a MTB''', and wherein the MTB''' is fed forward to the non-binary hamming code logic, modified and output from the non-binary hamming code logic as a MTB'''' to a multiplexor and output from the multiplexor to a CXL component.

7. The apparatus of claim 5 wherein if the non-binary hamming code logic and the binary hamming code logic determine that the MTB" contains no errors, then the MTB" is output to a multiplexor and output from the multiplexor to a CXL component.

8. The apparatus of claim 6, wherein the MTB" output to the multiplexor is determined by either the binary hamming code logic and/or the non-binary hamming code logic to contain plurality of errors then the MTB" is identified as poison.

9. The apparatus of claim 1, wherein the binary hamming code logic is configured to correct single bit errors.

10. The apparatus of claim 1, wherein the non-binary hamming code logic is configured to correct single byte errors.

11. A method for memory error detection and recovery in a decoding system, comprising:
receiving, into a first decoder within the decoding system, a memory transfer block (MTB) (i) comprising data and parity information and having (ii) a vertical portion and a horizontal portion;
performing error detection and correction on the vertical portion of the MTB using binary hamming code logic within the first decoder; and
performing error detection and correction on the horizontal portion of the MTB using a non-binary hamming code logic within the second decoder;
wherein the first and second decoders perform the error checking on the vertical and horizontal portions of the MTB simultaneously.

12. The method of claim 11, wherein the binary hamming code logic comprises an error correction coding (ECC) logic and the non-binary hamming code logic comprises a low power chip kill (LPCK) logic.

13. The method of claim 11, further comprising forwarding the MTB directly to a CXL component, bypassing the binary hamming code logic and the non-binary hamming code logic, if the binary hamming code logic and the non-binary hamming code logic each determine, upon receipt of the MTB, that the MTB contains no memory errors.

14. The method of claim 11, further comprising, upon initial receipt of the MTB, if either the binary hamming code logic or the non-binary hamming code logic determines that the MTB contains one or more initial errors, performs a decoding comprising:
forwarding the MTB to the binary hamming code logic for correction;
outputting a MTB' from the binary hamming code logic;
forwarding the MTB' to the non-binary hamming code logic for correction; and
outputting a MTB" from the non-binary hamming code logic.

15. The method of claim 14, further comprising, determining, after the MTB is output from the non-binary hamming code logic, if either the binary hamming code logic or the non-binary hamming code logic determines that the MTB still contains a remaining or a new error, performing an iterative decoding comprising:
directing the MTB" back to the binary hamming code logic for correction;
outputting an MTB''' from the binary hamming code logic;
forwarding the MTB''' to the non-binary hamming code logic for correction;
outputting an MTB" from the non-binary hamming code logic to a multiplexor; and
outputting the MTB" from the multiplexor to a CXL component.

16. The method of claim 14, wherein if the non-binary hamming code logic and the binary hamming code logic determine that the MTB" contains no errors, then the MTB" is output to a multiplexor and output from the multiplexor to a CXL component.

* * * * *